United States Patent [19]

Gustin et al.

[11] 4,372,045

[45] Feb. 8, 1983

[54] METHOD OF MANUFACTURING ELECTROSTATIC WRITE HEAD

[75] Inventors: Pol A. G. J. Gustin; Raymond G. G. Schayes, both of Brussels, Belgium

[73] Assignee: U.S. Philips Corporation, New York, N.Y.

[21] Appl. No.: 233,425

[22] Filed: Feb. 11, 1981

Related U.S. Application Data

[60] Division of Ser. No. 124,155, Feb. 25, 1980, Pat. No. 4,300,146, which is a continuation of Ser. No. 962,265, Nov. 20, 1978, abandoned.

[30] Foreign Application Priority Data

Dec. 8, 1977 [BE] Belgium ............................ 183,188

[51] Int. Cl.³ ............................................. H05K 3/00
[52] U.S. Cl. .................................................... 29/846
[58] Field of Search .......... 339/17 F, 176 MP, 126 R; 346/165; 29/603, 846, 885, 825, 843

[56] References Cited

U.S. PATENT DOCUMENTS

| 3,158,421 | 11/1964 | Hasenauer, Jr. | 339/17 F |
| 3,578,946 | 5/1971 | Colello | 29/825 X |
| 3,702,001 | 10/1972 | Gassino et al. | 346/165 |
| 3,723,635 | 3/1973 | Smith | 339/176 MP X |
| 4,111,510 | 9/1978 | Zurcher | 339/17 F |

Primary Examiner—Lowell A. Larson
Assistant Examiner—Carl J. Arbes
Attorney, Agent, or Firm—Joseph P. Abate

[57] ABSTRACT

A method of manufacturing an electrostatic write head comprises an insulating plate-shaped substrate having conductor tracks which extend as parallel conductor tracks in a strip-shaped region on the substrate. The substrate is divided into two plates along a dividing line which extends in the strip-shaped region, perpendicularly to the conductor strips. The two plates are subsequently joined so that their sides provided with conductor tracks face each other.

9 Claims, 8 Drawing Figures

METHOD OF MANUFACTURING ELECTROSTATIC WRITE HEAD

This application is a divisional of Ser. No. 124,155, filed Feb. 25, 1980, now U.S. Pat. No. 4,300,146 which is a continuation of Ser. No. 962,265, filed Nov. 20, 1978, now abandoned.

The invention relates to a method of manufacturing an electrostatic write head, in accordance with which a flat, insulating plate is provided with conductor tracks, in a manner which is commonly used for the manufacture of boards comprising surface wiring, in order to form write electrodes and connection conductors for these write electrodes. The write electrodes consist of mutually parallel end portions of the conductor tracks which terminate at an edge of the plate. The invention also relates to a write head thus manufactured.

A major problem encountered in the manufacture of electrostatic write heads consists in that on the one hand the distance between the electrodes should be as small as possible in order to obtain clearly legible writing or high resolution of the printed image, while on the other hand the conductors to be connected for connection of the electrodes to a control circuit may not be situated too near to each other. This problem can be partly solved by using the printed wiring technique during the manufacture. U.S. Pat. No. 3,618,118 describes an example in this respect, utilizing elongate printed circuit boards which are narrow at one end where the conductor tracks are situated near to each other to form the electrodes, while the other end is wider and accommodates connections. In order to form a write head, the narrow ends are adjacently arranged so that the electrodes are arranged in one line while the wide portions are arranged so as to imbricate. The accurate positioning of the narrow portions with respect to each other is time consuming and expensive. The cross-section of the conductors constituting the electrodes is rectangular so that the elements constituting the characters or images to be printed are line-shaped; however, square or circular elements are substantially less disturbing when the print is observed.

SUMMARY OF THE INVENTION

The object of the present invention is to provide a method of manufacturing an electrostatic write head in which the described drawbacks are eliminated.

The method in accordance with the invention is characterized in that a plate-shaped substrate is provided with conductor tracks which terminate at an end in a strip-shaped region on the substrate, every two directly adjacently terminating conductor tracks entering the strip-shaped region from opposite directions and the parts of the conductor tracks situated in the strip-shaped region extending parallel to each other. The substrate is divided into two plates or sections according to a dividing line which extends through the strip-shaped region, perpendicularly to the parts of the conductor tracks situated in this region. The two sections are then rotated around the dividing line so that the sides accommodating conductor tracks face each other; and insulating layer is provided between the sections at the area of the connection conductors and the sections are connected to each other.

A first embodiment of a write head in accordance with the invention is characterized in that the write head consists of two plates provided with surface wiring, the surface wiring of each plate comprising a number of mutually parallel conductor strips which are situated at equal distances from each other and which terminate at an edge of the plate. One of every two directly adjacent conductor strips is extended to form a connection conductor while the other conductor strip has a length which amounts to only a few times its width. The plates are connected to each other so that their sides provided with surface wiring face each other. Each conductor strip of the one plate which is provided with a connection conductor contacts a conductor strip of the other plate which is not provided with a connection conductor, thus forming a write electrode, an insulating layer is provided between the two plates at the area of the connection conductors.

A further embodiment which is distinguished by a very small distance between the electrodes is characterized in that the write head consists of two plates provided with surface wiring, the surface wiring of each plate comprising a number of mutually parallel conductor strips which are situated at equal distances from each other, terminate at an edge of the plate and are extended in order to form connection conductors. The plates are connected to each other so that their sides provided with surface wiring face each other, each conductor strip of the one plate is situated midway between two conductor strips of the other plate, with the exception of one of the outer conductor strips of each plate. The conductor strips form a row of mutually parallel write electrodes. An insulating layer is provided between the two plates at the area of the connection conductors.

The invention will now be described in detail with reference to the accompanying diagrammatic drawing, in which:

DESCRIPTION OF THE PREFERRED EMBODIMENTS

Figure 1:
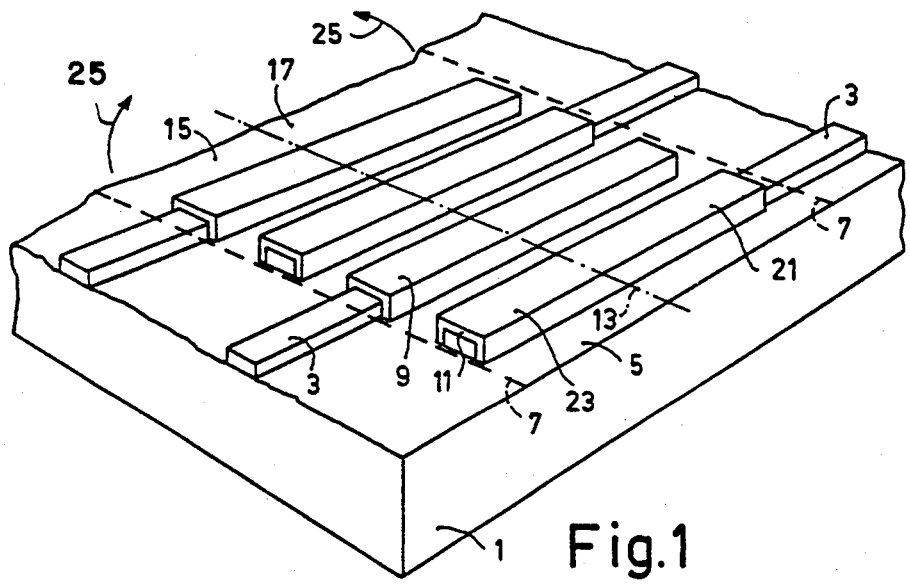
FIG. 1 is a perspective view at an increased scale of a part of a substrate provided with surface wiring which is used according to a preferred method in accordance with the invention.

In accordance with the invention, a plate-shaped insulating substrate 1 is provided with conductor tracks 3 which terminate in a strip-shaped region 5 on the substrate, the mutually opposite boundaries of which are denoted by broken lines 7 in FIG. 1.

Each successive laterally adjacent track 3 enters the strip-shaped region 5 from an opposite direction and the parts 9 of the tracks situated in this region extend parallel to each other. The tracks 3 are provided on the substrate 1 by means of one of the known methods of manufacturing printed circuit boards. They are thickened by way of an additional metal layer 11 at the area of the region 5 in the embodiment shown in FIG. 1. The parts of the tracks 3 which are situated outside the region 5 form connection conductors. They connect the parts 9 to connections (not shown), for example, solder points or plated-through holes in the substrate 1 (not shown). FIG. 1 clearly shows that the distance between the tracks 3 outside the region 5 amounts to twice the distance between the tracks inside the region 5, so that connection to these tracks is comparatively easy.

After provision of the additional metal layer 11, the substrate 1 is divided into two plates 15 and 17 according to a dividing line 13 (denoted as a stroke/dot line in FIG. 1) which extends through the strip-shaped region 5, perpendicularly to the tracks 9 in this region. The dividing line 13 intersects the track parts 9 so that each part is divided into a conductor strip 21 which is connected to a connection conductor and a conductor strip 23 without a connection conductor. The two plates 15 and 17 are then rotated towards each other around the dividing line 13 in the direction of the arrows 25 so that the sides of the plates 15 and 17 accommodating dating conductor tracks (the upper side in FIG. 1) face each other. A conductor strip 23 without a connection conductor is then situated each time against a conductor strip 21 with a connection conductor. Because these two conductor strips originally formed a single track part 9, their dimensions are exactly the same and their positioning with respect to each other is automatically perfect.

Figure 2:
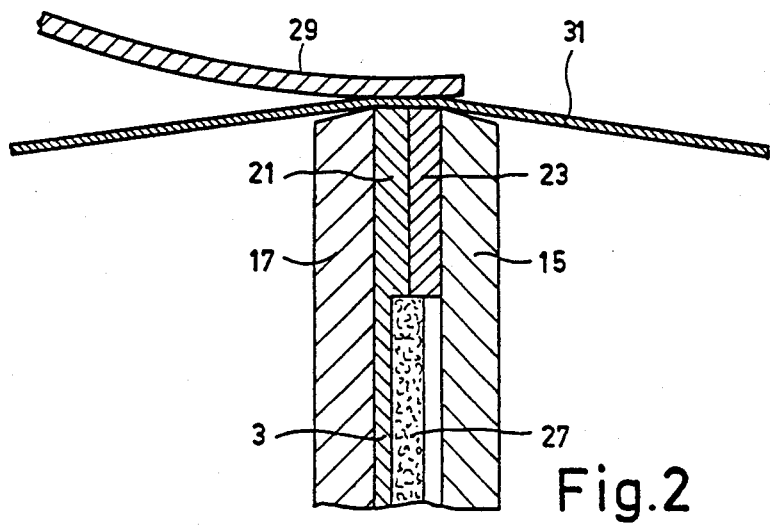
FIG. 2 is a cross-sectional view of a first embodiment of a write head in accordance with the invention.

At the area of the non-thickened tracks 3, forming the connection conductors, and insulating layer 27 is provided between the two plates 15 and 17, after which the assembly is joined, for example, by means of a suitable glue. FIG. 2 is a cross-sectional view of the write head thus formed. The thickened conductor strips 21 and 23 together form an approximately square write electrode which is capable, in conjunction with a counter electrode 29, of providing a point-shaped electrostatic charge image on the record carrier 31 in a known manner.

The substrate 1 may be made, for example, of fiber-glass-reinforced epoxy resin provided with copper tracks 3 having a thickness of 45 μm and a width of 90 μm. These tracks are electrolytically covered in the region 5 by copper layer 11 having a thickness of 30 μm so that the thickness of the track parts 9 amounts to 75 μm and their width to 150 μm. The electrodes then have a square section of 150 ×150 μm. The distance between the electrodes amounts to 100 μm so that per mm four electrodes are provided.

It is alternatively possible to make electrodes having a smaller cross section by ommission of the additional metal layer 11. However, in that case some clearance must exist between the plates 15 and 17 at the area of the connection conductors in order to prevent short-circuiting or capacitive coupling between neighboring connection conductors of the two plates. To this end, the insulating layer 27 may be constructed to be wedge-shaped as shown in FIG. 3; the thinnest portion then being situated near the write electrodes.

Figure 4:
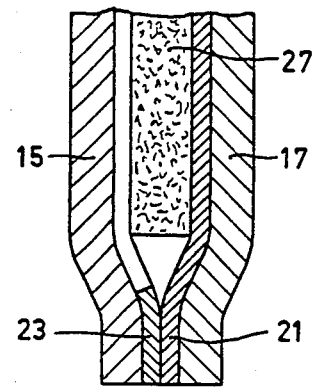

Another possibility is the selection of a flexible foil of synthetic material for the plates 15 and 17 as shown in FIG. 4. The plates are then in contact with each other at the area of the write electrodes and are bent in different directions from this area and are furthermore separated from each other by a flat insulating layer 27.

Figure 3:
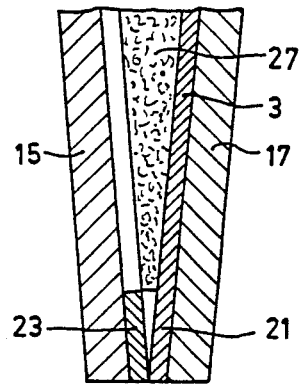
FIGS. 3 and 4 are cross-sectional views of two further embodiments.
Figure 5:
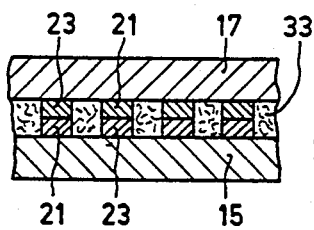
FIG. 5 is an end view of the write heads shown in the FIGS. 3 and 4.

The end view of the embodiments shown in FIGS. 3 and 4 is the same. See FIG. 5. Between the ends of the conductor strips 21, 23 which serve as the write electrodes, a layer of glue 33 which joins the two plates is visible. This glue is, for example, an epoxy glue.

Figure 6:
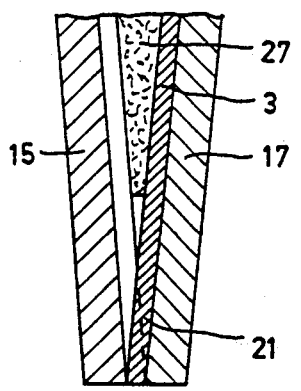
FIGS. 6 and 7 are cross-sectional views of two further embodiments.
Figure 7:
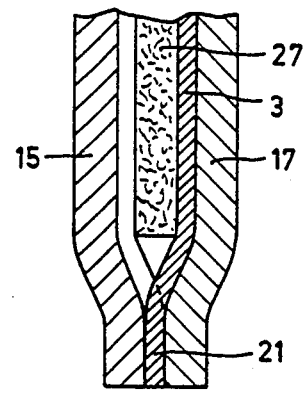
Figure 8:
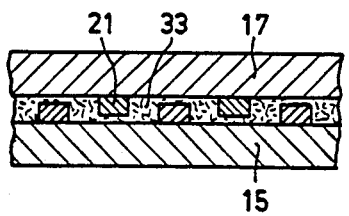
FIG. 8 is an end view of the write heads shown in the FIGS. 6 and 7.

As a result of the arrangment of the conductor strips 21 and 23 against each other, the thickness of the write electrodes amounts to twice the thickness of these conductor strips. There are cases where doubling of the thickness is not required, for example, when substantially square write electrodes are not required because line-shaped point elements are acceptable, or when the electrodes are so narrow that their width substantially equals the thickness of a conductor track 3. In such cases the conductor tracks 3 can be made to terminate at the dividing line 13 (FIG. 1) so that the dividing line, rather than intersecting the tracks, is tangent thereto. Analogous to the constructions shown in FIGS. 3 and 4, respectively rigid plates 15 and 17 can be combined with a wedge-shaped insulating layer 27 (FIG. 6), or flexible plates with a flat, insulating layer (FIG. 7). The end view of the write head thus formed is shown in FIG. 8.

What is claimed is:

1. A method of manufacturing an electrostatic write head having a medium scanning end, comprising the steps of:
   providing an insulating plate having one side which is substantially planar;
   providing a plurality of printed circuit-type conductor tracks on said one side of said plate, said conductor tracks each terminating at an end in a strip-shaped region having mutually opposite boundaries on said plate, successive laterally adjacent conductor tracks traversing a boundary in directions generally transverse to the boundary and entering said strip-shaped region from opposite directions, the parts of said conductor tracks situated inside said strip-shaped region extending parallel to each other, and the parts situated outside said strip-shaped region forming connection conductors, said tracks extending at least as far as a dividing line through said strip-shaped region perpendicular to the parts of said conductor tracks in said strip-shaped region;
   dividing said plate into first and second sections along said dividing line, whereby each of said conductor tracks has at least one end proximate to said dividing line;
   rotating said first and second sections towards each other around said dividing line so that the sides of said first and second sections on which conductor tracks are disposed face each other, said ends of said conductor tracks proximate to said dividing line constituting the medium scanning end portion of the electrostatic write head;
   providing an insulating layer between a portion of said first and second sections intermediate said conductor tracks at an area spaced from said dividing line, and
   joining said rotated first and second sections together, thereby providing an integral head.

2. A method of manufacturing a head as claimed in claim 1, wherein at least one of said provided conductor tracks extends through said strip-shaped region beyond said dividing line substantially to said respective opposite boundary.

3. A method of manufacturing a head as claimed in claim 1, wherein two only of said conductor tracks extend beyond said dividing line substantially to said respective opposite boundary, said two only being the outermost conductor tracks.

4. A method of manufacturing a head as claimed in claim 1, wherein at least one of said conductor tracks having its connection conductor on said first section terminates at a conductor end proximate to said dividing line, the conductor end of said at least one track being disposed midway between two adjacent conductor tracks having connection conductors on said second section.

5. A method of manufacturing a head as claimed in claim 4, wherein said two adjacent conductor tracks terminate at respective conductor ends proximate to said dividing line.

6. A method of manufacturing head as claimed in claim 4, wherein all of said tracks provided on said plate are equally spaced and terminate at conductor ends which are proximate to said dividing line such that, upon rotating said first and second sections towards each other, conductor tracks on said first section are disposed midway between two adjacent conductor tracks disposed on said second section.

7. A method of manufacturing a head as claimed in claim 1, further including the step of thickening said conductor tracks which are disposed inside said strip-shaped region by means of an additional metal layer prior to the step of dividing said plate into said first and second sections.

8. A method of manufacturing an electrostatic write head having a medium scanning end, comprising the steps of:

providing an insulating plate having one side which is substantially planar;

providing a plurality of printed circuit-type conductor tracks on said one side of said plate, said conductor tracks each terminating in a strip-shaped region on said plate, successive laterally adjacent conductor tracks entering said strip-shaped region from opposite directions, the parts of said conductor tracks situated inside said strip-shaped region extending parallel to each other, and the parts of said conductor tracks situated outside said strip-shaped region forming connection conductors;

dividing said plate into first and second sections along a dividing line which extends through said strip-shaped region perpendicularly to and through each of said conductor tracks in said strip-shaped region, thereby forming two ends on each conductor track proximate to said dividing line;

rotating said first and second sections towards each other around said dividing line so that the sides thereof accommodating conductor tracks face each other, said ends of said conductor tracks proximate to said dividing line constituting the medium scanning end portion of the electrostatic write head;

providing an insulating layer between a portion of said first and second sections intermediate said conductor tracks at an area spaced from said dividing line, and adhesively joining said rotated first and second sections together, thereby providing an integral head.

9. A method as claimed in claim 8, further including the steps of thickening said conductor tracks which are disposed inside said strip-shaped region by means of an additional metal layer prior to the step of dividing said plate into said first and second sections.

* * * * *